(12) United States Patent
Shim

(10) Patent No.: US 7,855,407 B2
(45) Date of Patent: Dec. 21, 2010

(54) CMOS IMAGE SENSOR AND METHOD FOR MANUFACTURING THE SAME

(75) Inventor: Hee Sung Shim, Gangneung-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 377 days.

(21) Appl. No.: 12/002,124

(22) Filed: Dec. 13, 2007

(65) Prior Publication Data

US 2008/0157150 A1 Jul. 3, 2008

(30) Foreign Application Priority Data

Dec. 27, 2006 (KR) .................. 10-2006-0135586

(51) Int. Cl.
*H01L 31/09* (2006.01)

(52) U.S. Cl. ............ 257/290; 257/291; 257/292; 257/293; 257/E31.073; 257/446; 257/504; 257/544; 257/545; 257/E29.019; 257/E21.544; 438/196; 438/218; 438/220; 438/356; 438/414

(58) Field of Classification Search ............ None
See application file for complete search history.

(56) References Cited

U.S. PATENT DOCUMENTS

2005/0116259 A1* 6/2005 Komori .............. 257/222
2005/0176167 A1* 8/2005 Lee .................. 438/60
2005/0176176 A1 8/2005 Shimokawa et al.
2006/0148194 A1* 7/2006 Lim .................. 438/419

OTHER PUBLICATIONS

German Office Action dated Sep. 21, 2010; German Patent Application No. 10 2007 060 836.7; German Patent and Trademark Office, Munich, Germany.

* cited by examiner

*Primary Examiner*—Minh-Loan T Tran
*Assistant Examiner*—Fei Fei Yeung Lopez
(74) *Attorney, Agent, or Firm*—The Law Offices of Andrew D. Fortney; Andrew D. Fortney

(57) ABSTRACT

Embodiments relate to a Complementary Metal Oxide Semiconductor (CMOS) image sensor, and to a method for manufacturing the same, that improves the low-light level characteristics of the CMOS image sensor. The CMOS image sensor has a photosensor unit and a signal processing unit, and may include a semiconductor substrate having a device isolating implant area provided with a first ion implant area and a complementary second ion implant area within the first ion implant area; a device isolating layer in the signal processing unit; a photodiode in the photosensor unit; and transistors in the signal processing unit. A crystal defect zone neighboring the photodiode may be minimized using the device isolating implant area between adjacent photodiodes so that a source of dark current can be reduced and the occurrence of interface traps can be prevented, making it possible to improve the low-light level characteristics of the image sensor.

20 Claims, 4 Drawing Sheets

CMOS IMAGE SENSOR AND METHOD FOR MANUFACTURING THE SAME

This non-provisional application claims priority under 35 U.S.C. §119(a) to Korean Patent Application No. 0135586/2006 filed on Dec. 27, 2006, the subject matter of which is hereby incorporated by reference.

BACKGROUND

The present disclosures relates to a Complementary Metal Oxide Semiconductor (CMOS) image sensor.

In general, an image sensor is a semiconductor device converting an optical image into an electrical signal. There is a complementary MOS (CMOS) image sensor adopting a switching manner, using a predetermined number of MOS transistors per unit pixel and sequentially detecting outputs using thereof, which is manufactured using CMOS fabrication techniques. Alternatively, another type of image sensor is a charge coupled device (CCD) where metal-oxide-silicon (MOS) capacitors are located very closer to each other and a charge carrier is stored and transferred in the capacitor, a control circuit, and a signal processing circuit as a peripheral circuit.

The CMOS image sensor, which can convert the optical information of a subject into electrical signals, is constituted by signal processing circuitry including photodiodes, an amplifier, an A/D converter, an internal voltage generator, a timing generator, digital logic, etc. Such circuitry can be included in one chip, having great advantages of reduction of space, power, and costs.

Meanwhile, the CMOS image sensor can be classified as a 3T type, a 4T type, and a 5T type, etc., according to the number of transistors per unit pixel. The 3T type is constituted by one photodiode and three transistors per unit pixel, and the 4T type is constituted by one photodiode and four transistors per unit pixel, etc.

Herein, an exemplary circuit and layout for the unit pixel of a 4T type CMOS image sensor will be described.

FIG. 1 is an equivalent circuit view of a 4T type CMOS image sensor of the related art, and FIG. 2 is a layout showing a unit pixel of a 4T type CMOS image sensor of the related art.

As shown in FIGS. 1 and 2, a unit pixel 100 of a CMOS image sensor comprises a photodiode 10 as a photoelectric converter and four transistors. The four transistors are a transfer transistor 20, a reset transistor 30, a drive transistor 40, and a select transistor 50, respectively. A load transistor 60 may be electrically connected to the output terminal OUT of the respective unit pixels 100.

A device isolating layer is formed on a semiconductor substrate by means of a STI (Shallow Trench Isolation) or LOCOS process defining an active area, wherein the active area includes the active areas of the four transistors. Herein, FD represents a floating diffusion area, Tx represents the gate of the transfer transistor 20, Rx represents the gate of the reset transistor 30, Dx represents the gate of the drive transistor 40, and Sx represents the gate of the select transistor 50.

In the unit pixel PX of the general 4T type CMOS image sensor, an active area is defined by forming a device isolating layer (not shown) in a portion of the substrate other than the active area, as shown in FIG. 2.

One photodiode PD is formed in a portion of the active area having a relatively wide width, and the gate electrodes 23, 33, 43, and 53 of the four transistors are formed in another portion of the active area. In other words, a transfer transistor 20 is formed using the gate electrode 23, a reset transistor 30 is formed using the gate electrode 33, a drive transistor 40 is formed using the gate electrode 43, and a select transistor 50 is formed using the gate electrode 53. Herein, the active areas of the respective transistors (excluding the channel regions under the respective gate electrodes 23, 33, 43, and 53) are implanted with impurity ions so that source/drain (S/D) areas of the respective transistors are formed.

Specifically describing the device isolating layer, the device isolating layer may be formed by Local Oxidation of Silicon (LOCOS) in a CMOS image sensor where the minimum line width of a circuit is 0.35 μm or more. However, the device isolating layer may be formed by STI (Shallow Trench Isolation), which is advantageous in a high-integration of a device, in a CMOS image sensor where the minimum line width is 0.25 μm 0.18 μm, or less.

When forming the device isolating layer in such a STI manner, in a boundary portion A of a photodiode adjacent to the device isolating layer, dislocation in the silicon lattice frequently occurs due to damage during the etching process for forming a trench structure. Such a dislocation portion A in a silicon lattice structure may serve as an electron trap, capturing electrons so that it can deteriorate low-light level characteristics of the CMOS image sensor. In other words, since the light quantity incident to the photodiode is small in a low-light level environment, the amount of charge to be subject to photoelectric conversion in the photodiode should be correspondingly small. However, it is believe that electrons captured in the electron traps described above may reproduce an image by passing through the transfer transistor 16 so that the characteristics of the image sensor deteriorates in a low-light level environment.

SUMMARY

Embodiments of the invention provide a CMOS image sensor and a method for manufacturing the same, improving the low-light level characteristics of the CMOS image sensor. Other embodiments of the invention may provide a structure and technique for reducing the size of a unit pixel and/or that enables effective sharing of transistors in adjacent unit pixels.

Embodiments of the invention provide a CMOS image sensor having a photosensor unit and a signal processing unit, comprising: a semiconductor substrate having a device isolating implant area therein, comprising a first ion implant area and a complementary second ion implant area within the first ion implant area; a device isolation layer in the signal processing unit; a photodiode in the photosensor unit; and transistors in the signal processing unit.

Other embodiments provide a method for manufacturing a CMOS image sensor, comprising forming a device isolation layer in a signal processing unit of the image sensor; forming a preliminary device isolating implant area in a photosensor unit by forming a first ion implant area in the semiconductor substrate; completing a device isolating implant area by forming a complementary second ion implant area within the first ion implant area; and forming a photodiode in the photosensor unit and transistors in the signal processing unit.

Other systems, methods, features and advantages will be, or will become, apparent to one with skill in the art upon examination of the following figures and detailed description. Nothing in this section should be taken as a limitation on those claims. Further aspects and advantages are discussed below in conjunction with the embodiments.

DETAILED DESCRIPTION

Hereinafter, a CMOS image sensor will be described with reference to the accompanying drawings.

Figure 1:
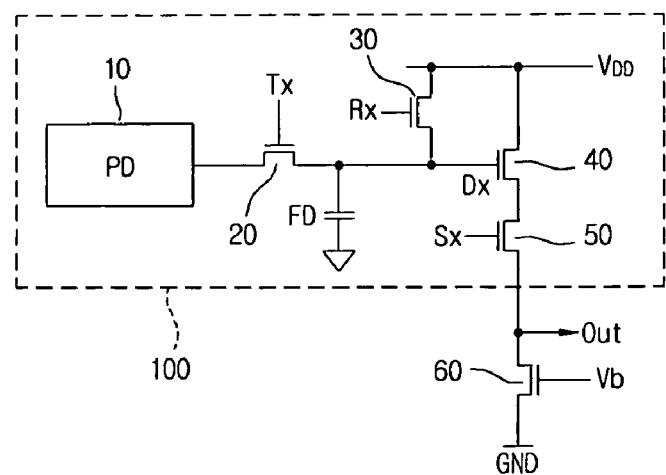
FIG. 1 is an equivalent circuit view of a 4T type CMOS image sensor of the related art.
Figure 2:
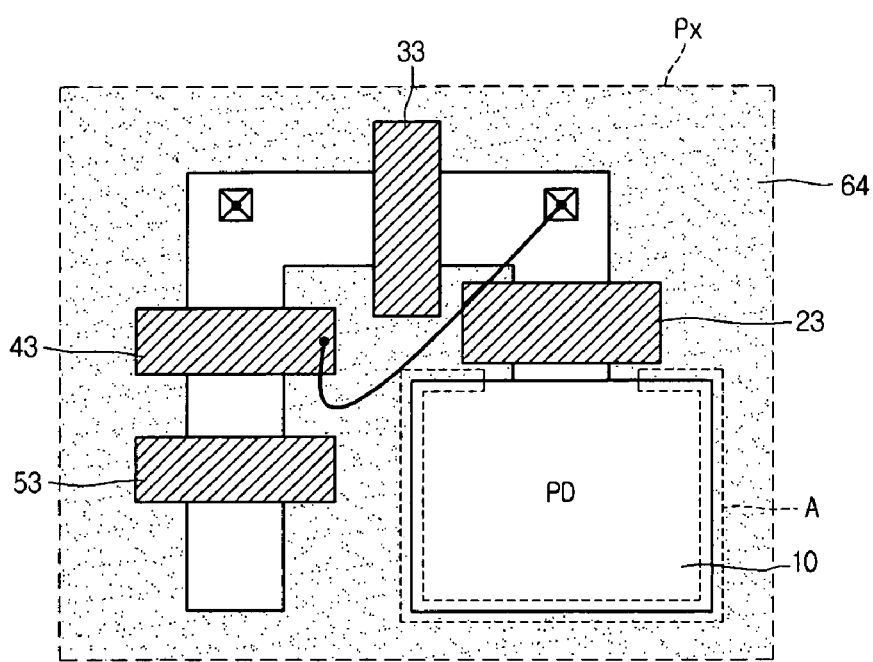
FIG. 2 is a layout of the unit pixel of a 4T type CMOS image sensor of the related art.
Figure 3:
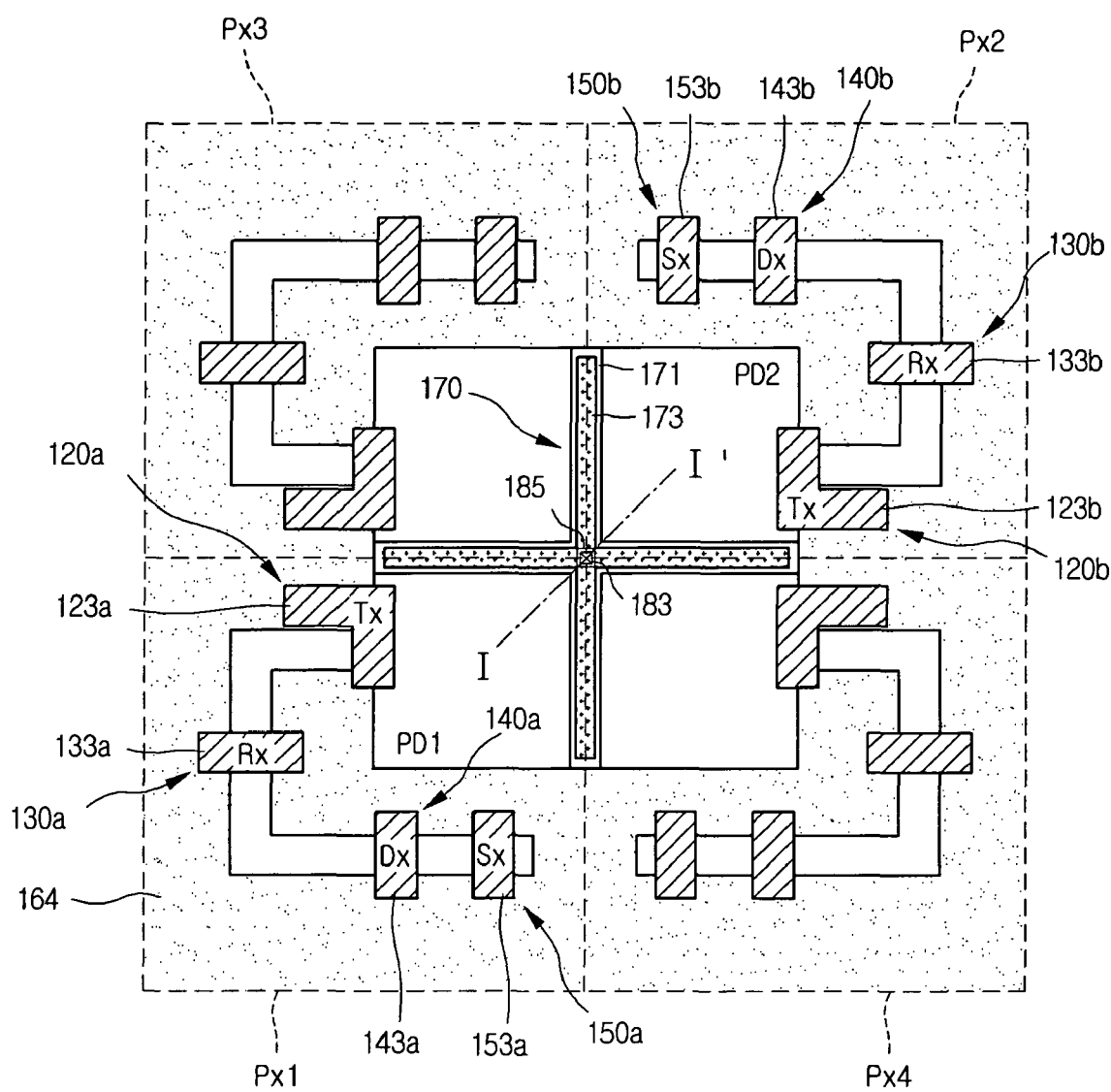
FIG. 3 is a layout of four unit pixels of a 4T type CMOS image sensor according to an exemplary embodiment.

FIG. 3 is a layout of a block of four unit pixels of a 4T type CMOS image sensor according to one embodiment of the invention. As shown in FIG. 3, first to fourth 4T type unit pixels PX1, PX2, PX3, and PX4 are adjacent to each other.

A CMOS image sensor can be largely divided into a photosensor unit that senses incident light to convert it into an electric signal, and a signal processing unit processing the output of the photosensor unit to reproduce an image.

Also, the photosensor unit may have a structure where part or all of a plurality of unit pixels are arrayed or combined, wherein the device isolating implant area is mainly at a photodiode boundary in the photosensor unit, and the device isolating layer in the signal processing unit uses a LOCOS or STI device isolating layer 164. Herein, although the photodiode areas of the first to fourth unit pixels PX1, PX2, PX3, and PX4 are adjacent to each other, it is not limited thereto. However, it is a layout for showing that a device isolation implant area between the photodiode areas of adjacent unit pixels is easily and/or well made.

Hereinafter, it will be described in detail by selecting the first and second unit pixels PX1 and PX2 among the first to fourth unit pixels PX1, PX2, PX3, and PX4.

A first photodiode area PD1 of the first unit pixel PX1 and a second photodiode area PD2 of the second unit pixel PX2 are isolated by means of the device isolating implant area 170. Each of the first unit pixel PX1 and the second unit pixel PX2 comprises photodiodes PD1 and PD2 as a photoelectric converter, and four transistors Rx, Dx, Tx, and Sx. The respective four transistors are transfer transistors 120a and 120b, reset transistors 130a and 130b, drive transistors 140a and 140b, and select transistors 150a and 105b. The device isolating layer 164 is formed on the semiconductor substrate by a Shallow Trench Isolation (STI) process defining an active area, wherein the active area includes active areas of the four transistors Rx, Dx, Tx, and Sx.

Herein, FD (not explained) represents a floating diffusion area, Tx represents the gate of the transfer transistors 120a and 120b, Rx represents the gate of the reset transistors 130a and 130b, Dx represents the gate of the drive transistors 140a and 140b, and Sx represents the gate of the select transistors 150a and 15b.

In the unit pixel of the general 4T type CMOS image sensor, since an active area is defined, the device isolating layer 164 is formed in the portion of the substrate other than the active area, and the device isolating implant area is formed at the boundary between adjacent photodiode areas.

In the first unit pixel PX1, a first photodiode PD1 is formed in the portion of the active area having a wide width, and the gate electrodes 123a, 133a, 143a, and 153a of the four transistors are formed in another portion of the active area. In the second unit pixel PX2, a second photodiode PD2 is formed in the portion of the active area having a wide width, and the gate electrodes 123b, 133b, 143b, and 153b of the four transistors are formed in another portion of the active area. In other words, in the first and second unit pixels PX1 and PX2, transfer transistors 120a and 12b are formed by a process including the gate electrodes 123a and 123b, reset transistors 130a and 130b are formed by a process including the gate electrodes 133a and 133b, drive transistors 140a and 140b are formed by a process including the gate electrodes 143a and 143b, and select transistors 150a and 150b are formed by a process including the gate electrodes 153a and 153b. In the first and second unit pixels PX1 and PX2, the active areas of the respective transistors excluding the lower side part of the respective gate electrodes 123, 133, 143, and 153 are implanted with impurity ions so that source/drain (S/D) areas of the respective transistors are formed.

The device isolating implant area 170 is formed by implanting impurities into the boundary region(s) between the photodiode areas PD1 and PD2. The device isolating ion implant area 170 comprises a first device isolating ion implant area 171 and a second device isolating ion implant area 173.

The first device isolating ion implant area 171 comprises or consists essentially of a low or moderate concentration of a p-type diffusion area, which may be deeply formed relative to the N-photodiode ion implant region(s) 128a and/or 128b (see FIG. 4A), and the second, complementary device isolating ion implant area 173 comprises or consists essentially of a high concentration of an n-type diffusion area relatively shallowly formed within the second device isolating ion implant area 173. In other words, the second device isolating ion implant area 173 is surrounded by the first device isolating ion implant are 171. Also, the second device isolating ion implant area 173 may be contact-connected to a reverse bias voltage or to a power source VDD.

The device isolating ion implant area 170, when a reverse bias voltage or a power source (e.g., Vdd) is applied thereto, forms a depletion layer 175 deeply and thickly in the substrate (e.g., an epitaxial silicon layer 111; see FIGS. 4B and 5B) so that the adjacent photodiode devices can be well isolated.

The second device isolating implant area 173 comprises an n-type diffusion area having a high concentration of dopant (e.g., phosphorous, arsenic or antimony), the first device isolating ion implant area 171 comprises a p-type diffusion area having a low or medium concentration of dopant (e.g., boron), and the substrate or epitaxial silicon layer 111 contains a p-well therein so that a depletion layer 173 is shallowly formed to the side of the n-type diffusion area 173 and is deeply formed in the direction from the first device isolating ion implant area 171 to the epi-layer 111.

The sides of the device isolating implant area 170 are provided with first and second photodiode areas PD1 and PD2, and the first and second photodiode areas PD1 and PD2 contain an n-type diffusion area having a low concentration of dopant so that the depletion layer 175 does not spread from the first device isolating ion implant area 171 to a photodiode area but is further deeply formed in the epi-layer 111.

Figure 4A:
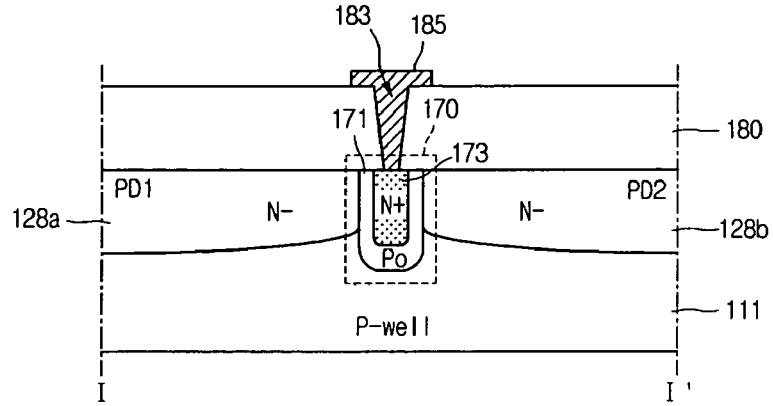
FIGS. 4A and 4B are cross-sectional views showing the cases when voltage is not applied to the device isolating implant area and when power supply voltage is applied to the device isolating implant area according to an embodiment.
Figure 4B:
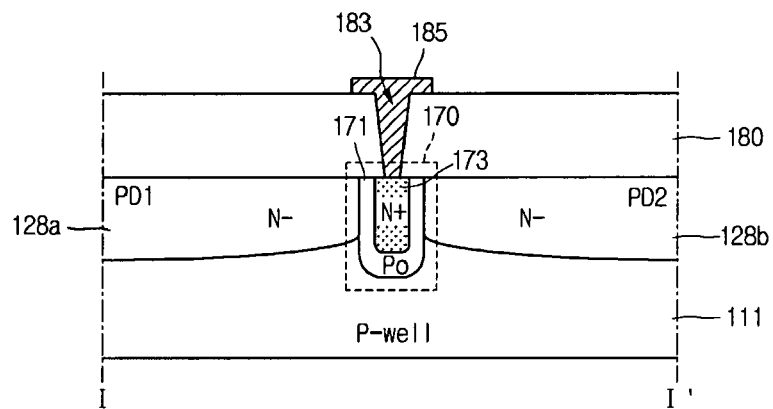

FIGS. 4A to 4B are cross-sectional vies taken along line I-I' of FIG. 3.

FIG. 4A is a cross-sectional view showing the case when voltage is not applied to the device isolating ion implant area according to a first embodiment, and FIG. 4B is a cross-sectional view showing the case when power supply voltage is applied to the device isolating ion implant area according to the first embodiment.

Figure 5A:
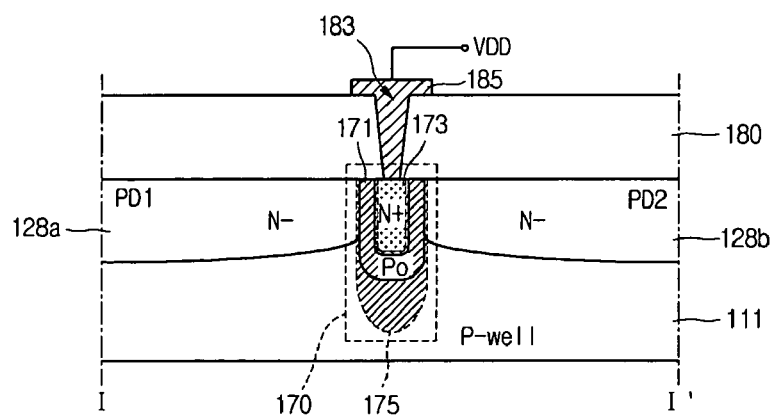
FIGS. 5A and 5B are cross-sectional views showing the cases when voltage is not applied to the device isolating implant area and when reverse-bias voltage is applied to the device isolating implant area according to another embodiment.
Figure 5B:
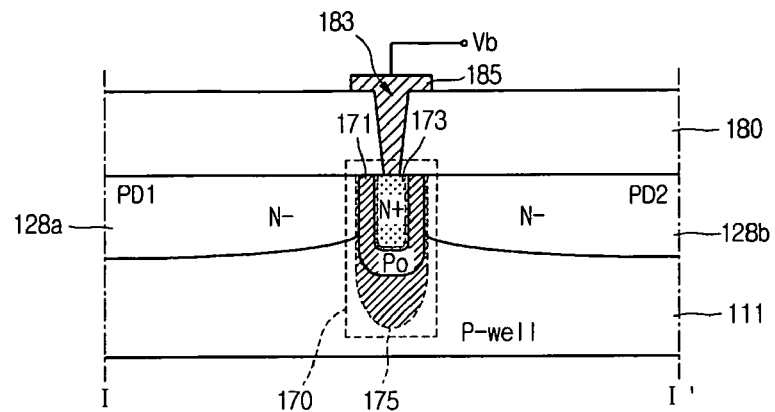

Also, FIG. 5A is a cross-sectional view showing the case when voltage is not applied to the device isolating ion implant area according to a second embodiment, and FIG. 5B is a cross-sectional view showing the case when reverse-bias voltage is applied to the device isolating ion implant area according to the second embodiment.

The first embodiment and the second embodiment are similar to each other in structure and operation, so that they will be described together.

Referring to FIGS. 4A and 5A, the device isolating ion implant area 170 is formed at the boundary between the first photodiode area PD1 and the second photodiode are PD2. The semiconductor substrate may be a p-type substrate having a high concentration of dopant impurities, p-type epi-layer 111 may be formed on the semiconductor substrate and may have a low concentration of dopant, a device isolating implant area 170 is formed in the p-type epi-layer 111 and may define (at least in part) an active area, and n-type first photodiode area 128a and second photodiode area 128b may formed in the p-type epi-layer 111 by implanting a low concentration of n-type impurities in the p-type epi-layer 111. An insulating film 180 may then be formed on the semiconductor device, and the insulating film 180 can be provided with a contact hole 183 exposing a (predetermined) portion of the second device isolating implant area 173.

Referring to FIGS. 4B and 5B, a contact electrode 185 in the contact hole 183 allows the second device isolating implant area 173 to have a reverse bias voltage or power supply applied thereto.

The device isolating ion implant area 170 is formed by implanting impurities into the boundary region between the first and second photodiode areas PD1 and PD2. The device isolating implant area 170 comprises a first device isolating implant area 171 and a second device isolating implant area 173. The first device isolating implant (diffusion) area 171 comprises a low or medium concentration of a p-type dopant and may be relatively deeply formed, and second device isolating implant (diffusion) area 173 comprises a high concentration of an n-type dopant relatively shallowly formed within the second device isolating ion implant area 173. In other words, the second device isolating ion implant area 173 is surrounded by the first device isolating ion implant are 171.

The second device isolating implant area 173 may then be contact-connected to a reverse bias voltage or to a power source VDD. In the device isolating implant area 170 having a reverse bias voltage or reverse voltage applied thereto (e.g., by being connected to the power source VDD), a depletion layer 175 is deeply and thickly formed in the epi-layer 111 so that adjacent devices can be well isolated.

As described above, if the device isolating ion implant area 170 is used instead of the device isolating layer, the occurrence of an interface trap resulting from etch damage during formation of an STI trench or a recessed LOCOS structure can be prevented, having an advantage that the photoprocessing characteristics at low light level can be improved.

With the embodiments as described above, the device isolating implant area is formed by implanting ions into at least a portion of the boundary between adjacent photodiodes, not by forming the device isolating layer such as LOCOS or STI, and the depletion layer, that is, the isolation area, is expanded by applying a reverse bias to the device isolating ion implant area, making it possible to electrically isolate one photodiode from another.

Accordingly, the crystal defect zone neighboring the photodiode is minimized using the device isolating implant area as the device isolating layer, instead of the STI layer which may generate dislocations in the lattice structure of the silicon wafer, so that the source of dark current can be reduced and the occurrence of interface traps can be reduced or prevented, making it possible to obtain a CMOS image sensor with improved low-light level characteristics.

With the embodiment, the crystal defect zone neighboring the photodiode is minimized using the STI device isolating layer and the device isolating ion implant area as the device isolating layer on the semiconductor substrate in the CMOS image sensor so that the source of dark current can be reduced and the occurrence of interface traps can be reduced or prevented, making it possible to improve the low-light level characteristics.

Figure 6:
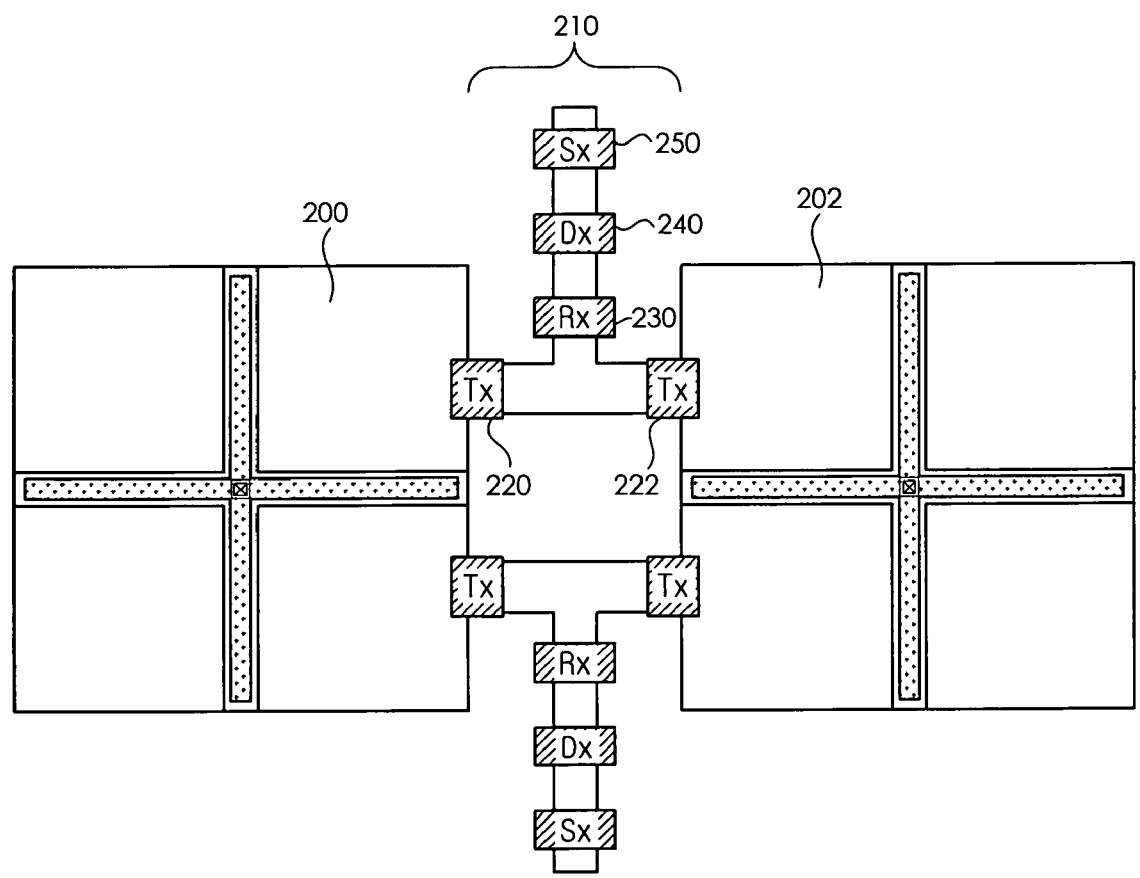
FIG. 6 shows an embodiment where transistors in the signal processing unit may be shared between adjacent photodiodes.

FIG. 6 shows an embodiment where transistors in the signal processing unit may be shared between adjacent photodiodes. Photodiodes 200 and 202 are adjacent to each other, separated by common signal processing unit 210 instead of device isolating implant area 170 (see FIGS. 4A-5B). Although each photodiode 200 and 202 have its own respective transfer transistor Tx 220 and 222, the two photodiodes 200 and 202 can share reset, drive and select transistors Rx 230, Dx 240 and Sx 250, effectively reducing the number of transistors per unit pixel to 2.5. One skilled in the art can easily modify the additional signal processing logic to identify which pixel (e.g., that containing photodiode 200 or that containing photodiode 202) outputs the electrical signal corresponding to photocharges generated in the corresponding photodiode at a predetermined time.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive. The above disclosed subject matter is to be considered illustrative, and not restrictive, and the appended claims are intended to cover all such modifications, enhancements, and other embodiments, which fall within the true spirit and scope of the present invention.

What is claimed is:

1. A CMOS image sensor, comprising:
   a semiconductor substrate having a photosensor unit and a device isolating implant area comprising a first ion implant area and a complementary second ion implant area within the first ion implant area, a first depletion layer at a junction location of the first ion implant area and the second ion implant area, and a second depletion layer at a junction location of the second ion implant area and the semiconductor substrate, wherein the second depletion layer has a greater thickness than the first depletion layer;
   a device isolating layer in a signal processing unit on the semiconductor substrate;

a photodiode in the photosensor unit; and transistors in the signal processing unit.

2. The CMOS image sensor according to claim 1, wherein the first ion implant area comprises a p-type dopant, and the second ion implant area comprises an n-type dopant.

3. The CMOS image sensor according to claim 1, wherein the semiconductor substrate comprises a p-type epitaxial silicon layer.

4. The CMOS image sensor according to claim 1, further comprising a contact electrode connected to the second ion implant area, configured to apply a reverse voltage to the second ion implant area.

5. The CMOS image sensor according to claim 1, wherein the second ion implant area is connected to a power source.

6. The CMOS image sensor according to claim 1, wherein the second ion implant area is surrounded by the first ion implant area.

7. The CMOS image sensor according to claim 1, wherein the photodiode is divided into at least two areas by the device isolating implant area.

8. The CMOS image sensor according to claim 1, wherein the photosensor unit comprises photodiodes for at least two unit pixels, the respective unit pixels comprising at least two transistors.

9. The CMOS image sensor according to claim 8, wherein the device isolating implant area is formed at boundary between adjacent unit pixels.

10. A method for manufacturing a CMOS image sensor having a photosensor unit and a signal processing unit, comprising the steps of: forming a device isolating layer in the signal processing unit in a semiconductor substrate; forming a preliminary device isolating implant area in the photosensor unit by forming a first ion implant area in the semiconductor substrate; completing a device isolating implant area by forming a complementary second ion implant area within the first ion implant area, a first depletion layer at a junction location of the first ion implant area and the second ion implant area, and a second depletion layer at a junction location of the second ion implant area and the semiconductor substrate, wherein the second depletion layer has a greater thickness than the first depletion layer; and forming a photodiode in the photosensor unit and transistors in the signal processing unit.

11. The method according to claim 10, further comprising:
forming an insulating film on the photodiode and the transistors;
forming a contact hole in the insulating film exposing a surface of the second ion implant area; and
forming a contact in the contact hole electrically connected to the second ion implant area.

12. The method according to claim 10, wherein a depletion layer of the device isolating implant area becomes deeper when a reverse voltage is applied to the second ion implant area.

13. The method according to claim 10, wherein the first ion implant area comprises a p-type dopant, and the second ion implant area comprises an n-type dopant.

14. The method according to claim 11, wherein a reverse voltage is applied to the contact.

15. The method according to claim 11, wherein a power supply voltage is applied to the contact.

16. The method according to claim 10, wherein the photosensor unit comprises photodiodes in at least two unit pixels, wherein each unit pixel comprises at least two transistors.

17. The method according to claim 16, wherein the device isolating implant area is at the boundary between adjacent unit pixels.

18. A CMOS image sensor, comprising:
a semiconductor substrate having a photosensor unit and a device isolating implant area comprising a first ion implant area and a complementary second ion implant area within the first ion implant area, wherein the first ion implant area comprises a p-type dopant, and the second ion implant area comprises an n-type dopant;
a device isolating layer in a signal processing unit on the semiconductor substrate;
a photodiode in the photosensor unit; and
transistors in the signal processing unit.

19. The CMOS image sensor according to claim 18, further comprising a contact electrode connected to the second ion implant area, configured to apply a reverse voltage to the second ion implant area.

20. The CMOS image sensor according to claim 18, wherein the device isolating implant area is formed at boundary between adjacent unit pixels.

* * * * *